United States Patent
Beffa

(10) Patent No.: US 7,368,993 B2
(45) Date of Patent: May 6, 2008

(54) TRANSCONDUCTANCE CIRCUIT WITH IMPROVED LINEARITY

(75) Inventor: Federico Alessandro Fabrizio Beffa, London (GB)

(73) Assignee: MediaTek Inc., Hsin-Chu (TW)

( * ) Notice: Subject to any disclaimer, the term of this patent is extended or adjusted under 35 U.S.C. 154(b) by 125 days.

(21) Appl. No.: 11/351,989

(22) Filed: Feb. 10, 2006

(65) Prior Publication Data

US 2007/0188234 A1  Aug. 16, 2007

(51) Int. Cl.
*H03F 3/16* (2006.01)
(52) U.S. Cl. ....................................... 330/277
(58) Field of Classification Search ................ 330/277, 330/258
See application file for complete search history.

(56) References Cited

U.S. PATENT DOCUMENTS 6,396,311 B2 * 5/2002 Inn .............................. 327/70

2006/0097788 A1 * 5/2006 Yang et al. .................. 330/258

* cited by examiner

*Primary Examiner*—Robert Pascal
*Assistant Examiner*—Hieu Nguyen
(74) *Attorney, Agent, or Firm*—Fish & Richardson P.C.

(57) ABSTRACT

A transconductance circuit, comprising: first and second field effect transistors, each having a drain, a source and a gate; wherein the first transistor is in a first current flow path between first and second nodes of the circuit, and is biased so as to operate in a saturation region of its transfer characteristic; the second field effect transistor is in a second current flow path between the first and second nodes of the circuit and is biased so as to operate in a linear region of its transfer characteristic; the gate of the first and second transistors are connected to receive an input signal; and wherein the second transistor is further in series with a voltage modulator adapted to reduce the drain-source voltage occurring across the second transistor in response to increased current flow in the second transistor.

28 Claims, 10 Drawing Sheets

TRANSCONDUCTANCE CIRCUIT WITH IMPROVED LINEARITY

FIELD OF THE INVENTION

The present invention relates to a transconductance circuit, suitable for use in an amplifier.

BACKGROUND OF THE INVENTION

It is often necessary to amplify an signal. A simple amplifier stage is shown in FIG. 1 wherein a field effect transistor 1 has an impedance 2 connected between its drain terminal and a positive supply rail 3. A source terminal of the field effect transistor 1 may be connected to a negative supply or ground rail either directly as shown or via a further impedance. A gate of the field effect transistor 1 is supplied with a DC bias voltage from a bias generating circuit 4 and an AC signal to be amplified which is decoupled from the bias circuit 4 via a decoupling capacitor 5.

For an ideal transconductor the current flowing in a current flow path through the transconductor would be linearly related to a control voltage applied to a control terminal of the transconductor, and the transconductor draws no current at its control terminal.

However, real transistors have characteristics which differ significantly from idealised devices. The field effect transistor is commonly used in transconductance amplifiers because it's input impedance is high. However it is well known that a field effect transistor has a drain-source current $I_D$ which for an idealised transistor exhibits the following characteristics $$I_D = 0 \text{ when } V_{gs} - V_{th} < 0 \quad \text{Equation 1}$$

where $V_{gs}$=gate source voltage $V_{th}$=threshold voltage of the FET

In a so called "linear region", also known as a "triode region" of the device characteristic where $V_{DS}$ is greater then zero but less than $(V_{gs}-V_{th})$ the drain current is as follows:

$$I_D = \beta\left((V_{gs} - V_{th})V_{DS} - \frac{V_{DS}^2}{2}\right) \quad \text{Equation 2}$$

where:

β is a constant which, amongst other things is proportional to the ratio of the FET channel width to the channel length.

$V_{DS}$=drain-source voltage.

However once $V_{DS}$ exceeds $(V_{gs}-V_{th})$ the device enters its saturation region where $$I_D = \frac{\beta}{2}(V_{gs} - V_{th})^2 \quad \text{Equation 3}$$

Following on from these idealised equations, we see that in the saturation region, the transconductance $g_m$ is $$g_m = \frac{dI_D}{dV_{gs}} = \beta(V_{gs} - V_{th})$$

However, real devices can deviate from these ideal characteristics.

FIG. 2a illustrates a transfer characteristic of a NMOS FET constructed having a gate dimension of 100 μm by 0.18 μm fabricated using a 0.18 μm CMOS technology as typically found in an integrated circuit, and showing the drain current as a function of the gate-source voltage. It will be seen that the transistor is essentially non conducting until the gate-source voltage exceeds the threshold voltage of the transistor which in this example is around 0.4 volts. From then on the current rises in a non linear manner until a gate-source voltage which is approximately 1 volt is reached and from then on the curve is approximately linear. In this final region the second and third order derivatives of drain current with respect to gate-source voltage have become reasonably small. However, these are all qualative rather than quantative assessments of the transistor's performance. It should also be noted that operating a transistor in this region can be relatively power hungry.

In these examples the drain-source voltage was held fixed at 1 volt.

The linearity of the response can be examined by looking at the derivatives of the curve $I_{DS}$ versus $V_{GS}$ shown in FIG. 2a. FIG. 2b shows the first derivative of drain current with respect to gate-source voltage, i.e. the transconductance, and it can be seen that between 0.5 volts and approximately 0.7 volts there is quite a marked change in the rate of change of current with respect to gate-source voltage corresponding to the curved area generally designated 6 in FIG. 2a. In this region the gradient of the curve looks substantially constant. However from about 1.2 volts onwards the first derivative is substantially constant. FIGS. 2c and 2d show the second derivative and the third derivative of the transfer characteristic of the transistor. These higher order derivatives represent sources of harmonic distortion when amplifying a signal, and represent sources of inter-signal mixing i.e. the creation of inter-modulation products when two or more signals having distinct frequencies are presented to the amplifier.

It is known that the distortion in small signal amplifiers can be represented by a Taylor series. If we consider only the lower order components of such an expansion, we have $$I_D \approx I_{DO} + g_1 V_{in} + g_2 V_{in}^2 + g_3 V_{in}^3$$

where $$g_n = \frac{dI^n}{dV_{gs}^n}$$

Where n=1, 2, 3 . . .

It is known that the distortion resulting from the second derivative or the distortion resulting from the third derivative can be reduced to substantially zero provided the individual transistor is biased to a specific biased voltage which, unfortunately, is unique to that transistor. Thus, if a batch of identical circuits are made in a fabrication process, tiny variations from wafer to wafer and indeed from one transistor to another transistor within the same integrated circuit would mean that each transistor would have a slightly different bias point for, for example, reducing the third order derivative to zero even though the transistors were nominally identical.

Even so, it can be seen that if a transistor is biased to a point where the 3rd derivative is zero, the second derivative is still likely to have a significant non-zero value. Therefore this approach merely trades one source of distortion for another. In circuits, like that shown in FIG. 1, where no feedback is provided, the dominant source of third-order intermodulation products ($IM_3$) is the 3rd order non-linearity, $g_3$ shown in FIG. 2d. reducing $g_3$ can be achieved, for example, by biasing the transistor to the point where $g_3$ is zero.

In circuits having feedback the situation can become more complex. For transistors having a series-series feedback scheme (i.e. an impedance placed between the source terminal and ground) then there are two dominant mechanisms giving rise to third-order intermodulation products. These are 1) 3rd order non-linearity within the transistor as characterised by $g_3$.
2) 2nd order non-linearity as characterised by $g_2$.

One might suppose that linearity could be achieved by merely operating a relatively large gate-source voltages where the drain-source current tends to become a linear function of the gate source voltage. Whilst this can work, it is a power hungry solution that is not suitable for a large number of applications, such as mobile radio or mobile telephones.

These non-linearities are particularly undesirable in amplifiers, such as radio frequency amplifiers, which may be required to amplify a relatively weak wanted signal, designated S in FIG. 3, in the presence of stronger interfering signals designated $I_1$ and $I_2$. In the scenario shown in FIG. 3 the frequency difference between the wanted signal S and the first interferer $I_1$ is the same as the frequency difference between the interferer $I_1$ and a second interferer $I_2$. Thus non-linearities within the amplifier stage give rise to mixing of the interfering signals I and $I_2$ such that a new interfering signal $I_3$ is generated within the amplifier which has the same frequency as the wanted signal S and which, as a consequence may impact on the ability of the receiver to recover the wanted signal S or which may inhibit reception of that signal completely.

SUMMARY OF THE INVENTION

According to a first aspect of the invention there is provided a transconductance circuit, comprising: first and second field effect transistors, each having a drain, a source and a gate; wherein the first transistor is in a first current flow path between first and second nodes of the circuit, and is biased so as to operate in a saturation region of its transfer characteristic; the second field effect transistor is in a second current flow path between the first and second nodes of the circuit and is biased so as to operate in a linear region of its transfer characteristic; the gate of the first and second transistors are connected to receive an input signal; and wherein the second transistor is further in series with a voltage modulator adapted to reduce the drain-source voltage occurring across the second transistor in response to increased current flow in the second transistor.

It is thus possible to provide a transconductance circuit which behaves as if it is a field effect transistor but where the transconductance exhibits increased linearity over a selected signal range. By biasing the first transistor into the "saturation region" of its characteristic the effective transconductance of the first transistor increases with increasing signal voltage, whereas by biasing the second transistor into the "linear region" and causing its drain-source voltage to vary so as to decrease with respect to increases in the input voltage $V_{in}$ increases, then the effective transconductance of the second transistor decreases with increasing signal voltage. The transistors are in parallel and consequently the transconductance circuit can exhibit an improvement in the linearity of its transconductance over an operating window where the changes in transconductance of the first and second transistors can be arranged to substantially cancel one another.

Preferably the voltage modulator comprises a third field effect transistor in series with the second field effect transistor Advantageously the gates of the second and third transistors are biased at the same bias potential. The gates of the second and third transistors do not need to be biased at exactly the same potential but this is a convenient choice. The third transistor acts to drop the voltage across its gate and source terminals such that the drain-source voltage across the second transistor is sufficiently low for it to be biased into its "linear region". It also causes the drain-source voltage of the second transistor to be modified as a function of the gate-source voltage. This is because the gate voltage of the third transistor is held constant. Therefore, as the current flow through the transistor increases, the gate-source voltage must also increase in accordance with the transistors transfer characteristic. Hence the drain voltage of the second transistor decreases.

However, the voltage modulator could be another component, such as a resistor. It is advantageous to make the drain source voltage of the second transistor independent of changes in the voltage at the second node of the circuit, hence a further transistor is generally preferred. However, in some uses of the transconductance circuit, the voltage at the second node may be nominally constant (for example because the transconductance circuit drives a "load" including a cascode transistor), in which case a resistor can suffice as the voltage modulator.

According to a second aspect of the present invention there is provided a method of compensating for non-linearities of a first field effect transistor, where the first transistor is operated as an amplifier and is, in use, biased into its saturation region of its transfer characteristic, the method comprising the steps of providing a second field effect transistor in parallel with the first transistor, the second transistor being biased into its "linear region" and in series with a device for varying the drain-source voltage of the second transistor as a function of the gate source voltage such that changes in its transconductance with respect to input voltage partially or wholly cancel changes in transconductance of the first transistor.

BRIEF DESCRIPTION OF THE DRAWINGS

Embodiments of the present invention described, by way of example only, with reference to the accompanying drawings, in which.

DESCRIPTION OF PREFERRED EMBODIMENTS

Figure 1:
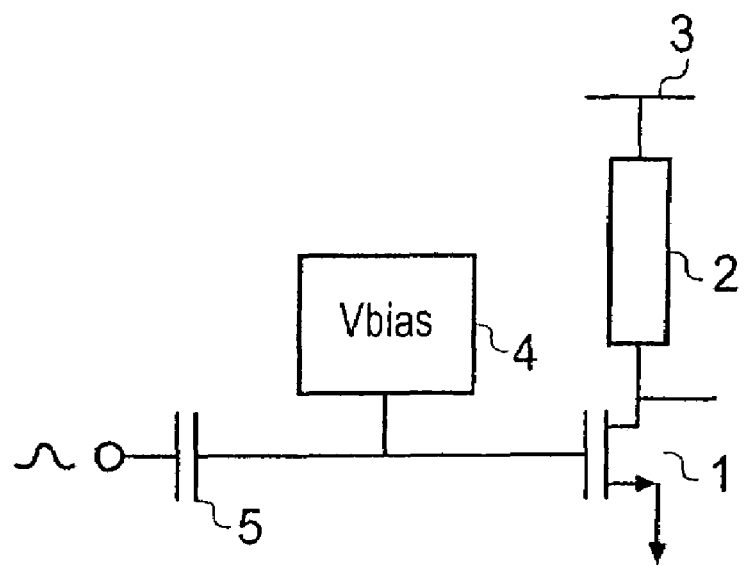
FIG. 1 schematically illustrates a simple amplifier.
Figure 3:
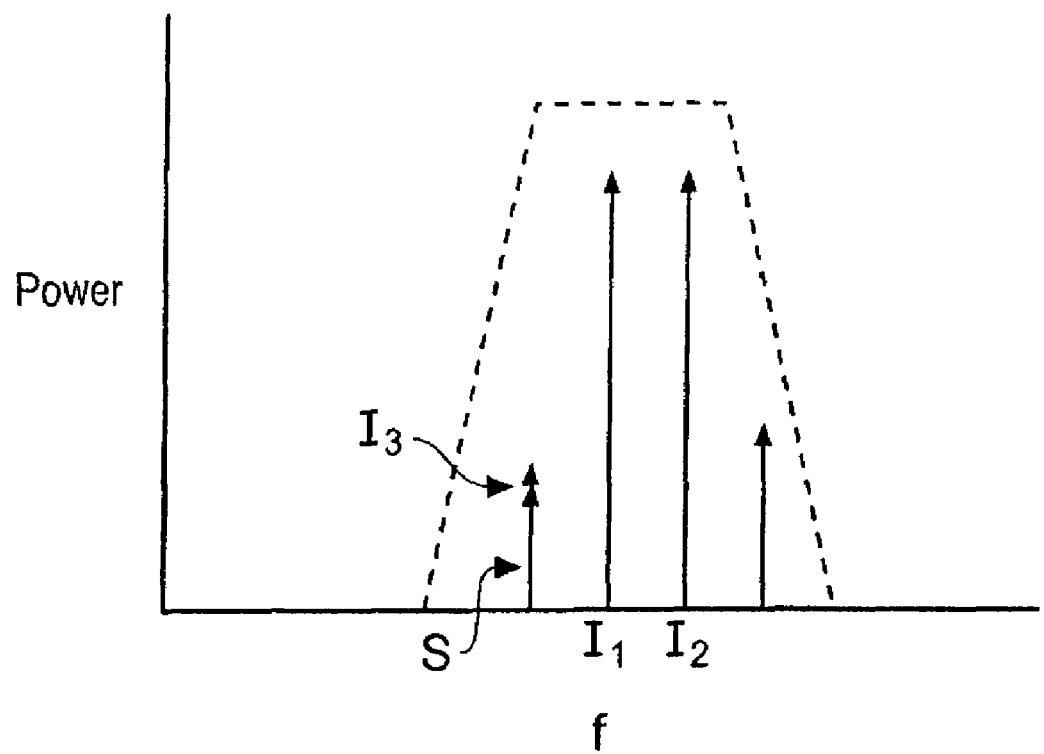
FIG. 3 schematically illustrates generation of inter-modulation products within a receiver due to non-linearities within an amplifier.
Figure 2A:
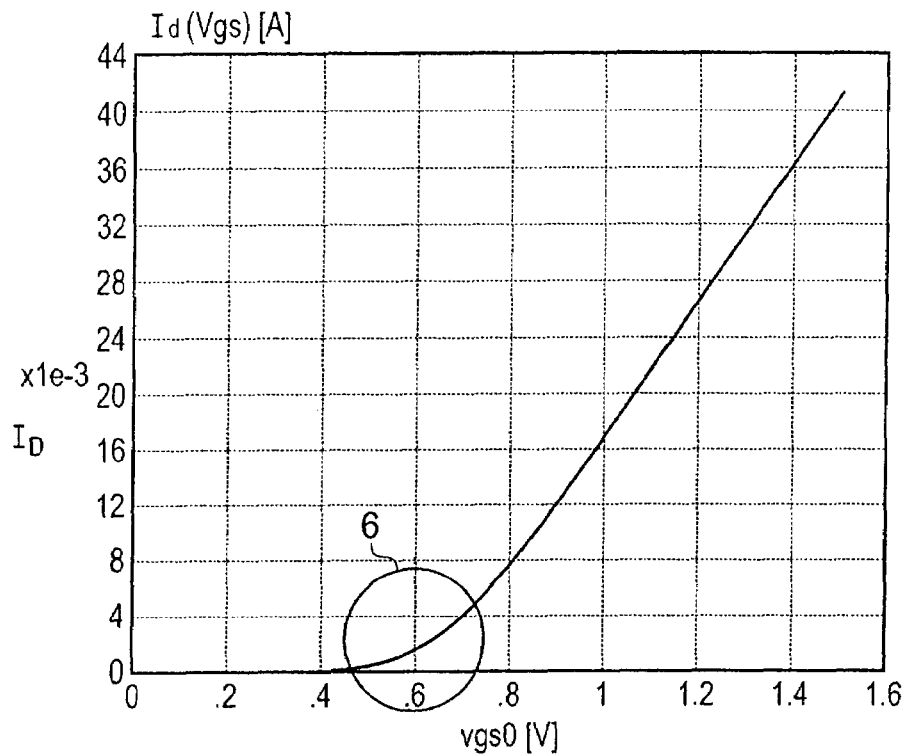
FIGS. 2a to 2d illustrate $I_{DS}$ versus $V_{GS}$ and the first, second and third derivatives thereof, respectively.
Figure 2B:
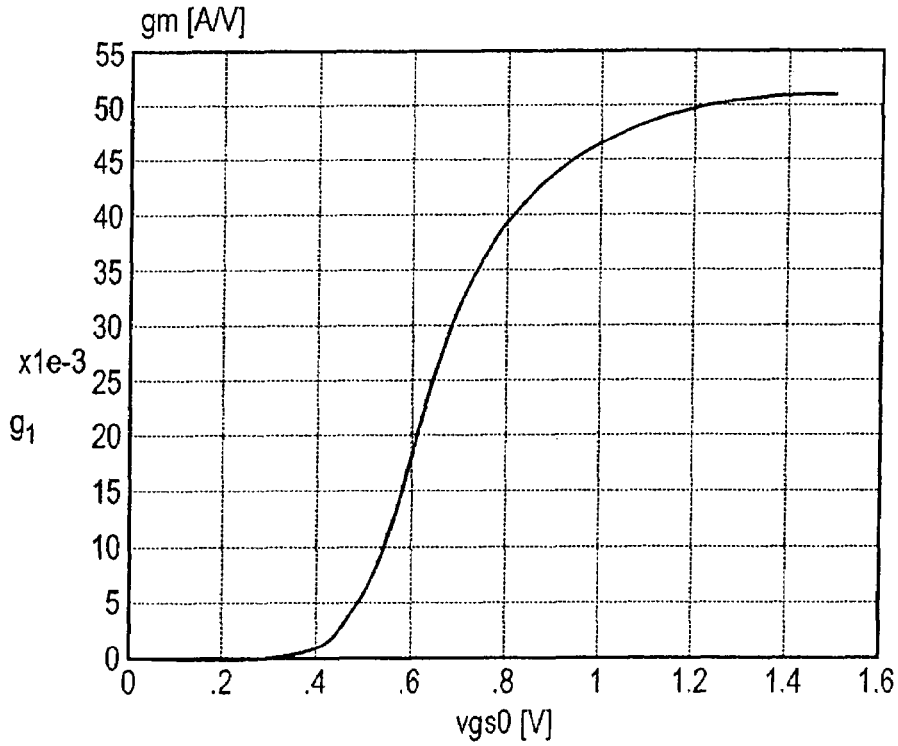
Figure 2C:
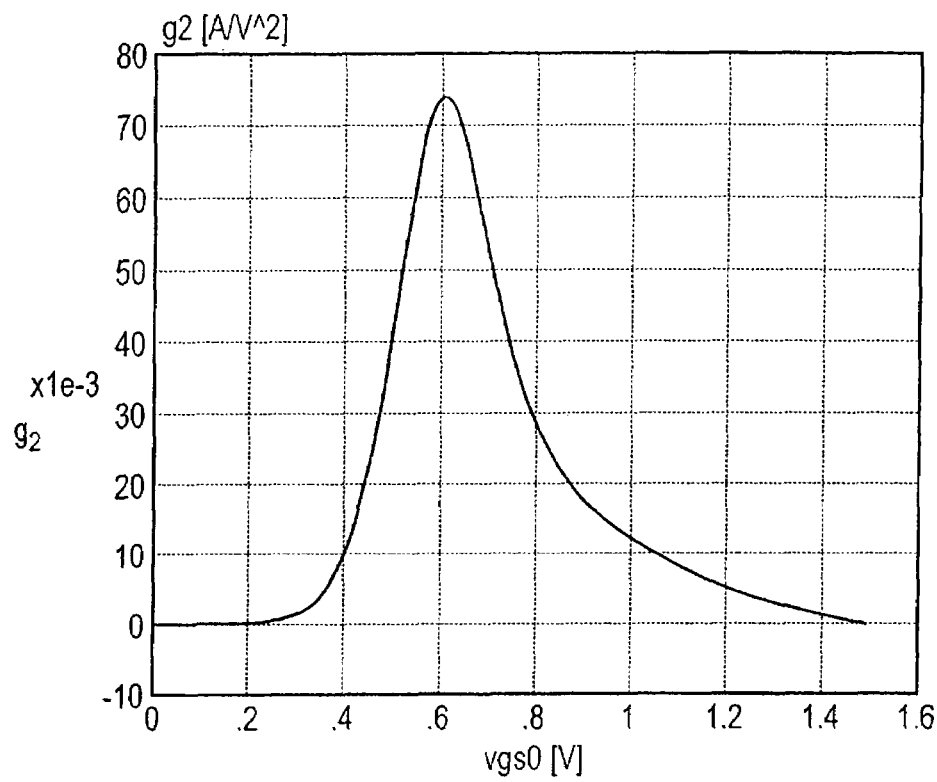
Figure 2D:
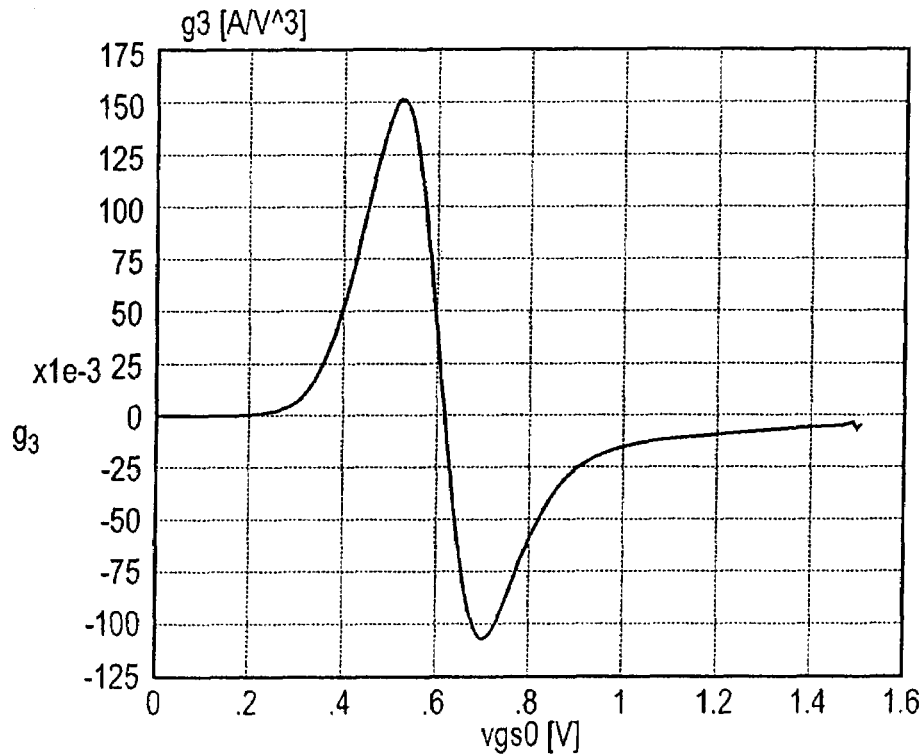
Figure 4:
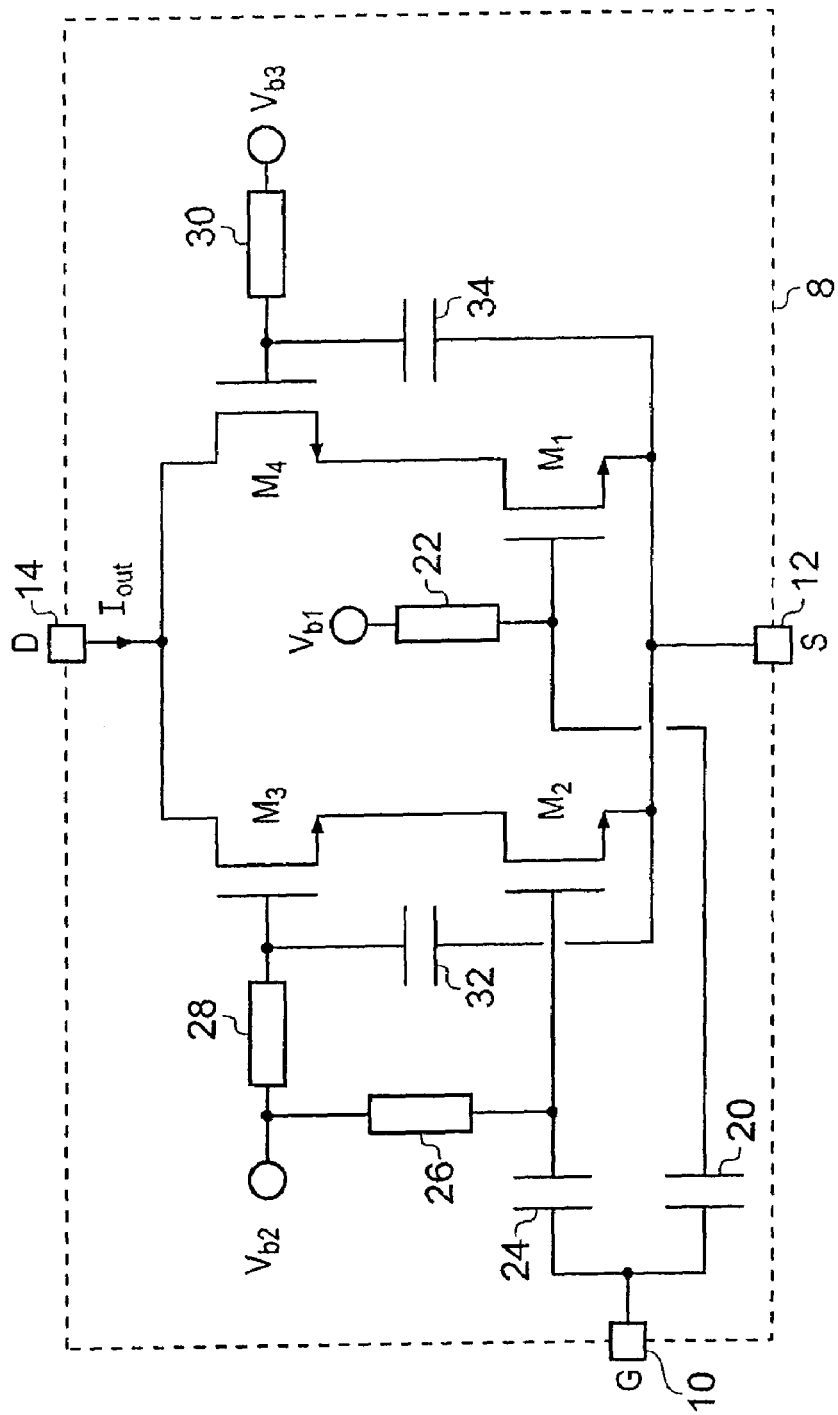
FIG. 4 is a circuit diagram of a circuit constituting an embodiment of the present invention.

FIG. 4 schematically illustrates a transconductance circuit constituting an embodiment of the present invention. The circuit comprises four transistors, labelled $M_1$ to $M_4$, although the fourth transistor forms a cascode stage and can be omitted and hence the drain of $M_1$ can be directly connected to the terminal 14.

The transconductance circuit takes the place of a field effect transistor gain stage and has first, second and third terminals 12, 14 and 10 which correspond to the source, drain and gate of an equivalent transistor, and where the source and drain terminals correspond to first and second nodes of the transconductance circuit. The first transistor $M_1$ has its gate connected to the gate terminal 10 via a first DC blocking capacitor 20. A source of the transistor $M_1$ is connected to the source terminal (first node) 12 of the transconductance circuit 8. A drain of the transistor $M_1$ is in current flow communication with the drain terminal (second node) 14 of the transconductance circuit 8, in this example, via intermediate transistor $M_4$. If the fourth transistor $M_4$ was omitted, then the drain of the first transistor $M_1$ would be directly connected to the drain terminal 14 but, in the arrangement shown in FIG. 4 the drain of the transistor $M_1$ is connected to the source of the fourth transistor $M_4$ and the drain of the fourth transistor $M_4$ is connected to the drain at terminal 14 of the transconductance circuit.

A gate of the first transistor $M_1$ is connected to a first bias node $V_{b1}$ via a resistor 22.

The second transistor $M_2$ also has its source terminal connected to the source terminal 12 of the transconductance circuit and its gate is connected to the gate terminal 10 via a second DC blocking capacitor 24. The gate terminal is connected to a second bias node $V_{b2}$ via a resistor 26. A drain of the second transistor $M_2$ is connected to a voltage modulator, and more specifically to the source of a third transistor $M_3$, whose drain is connected to the drain at terminal 14 and whose gate is also connected to the second bias node $V_{b2}$ via a resistor 28. Finally, a gate of the fourth transistor is connected to a third bias node $V_{b3}$ via a resistor 30. The resistors 28 and 30 are only needed if the transconductance circuit is to be degenerated, that is if there is an impedance connected between the source node 12 and ground. If this occurs, then resistors 28 and 30 have a non zero value and similarly AC coupling capacitors 32 and 34 are also provided such that the voltage between the gate of transistor $M_3$ and node 12 and between the gate of transistor $M_4$ and node 12 remains constant in the presence of an AC signal.

Figure 5:
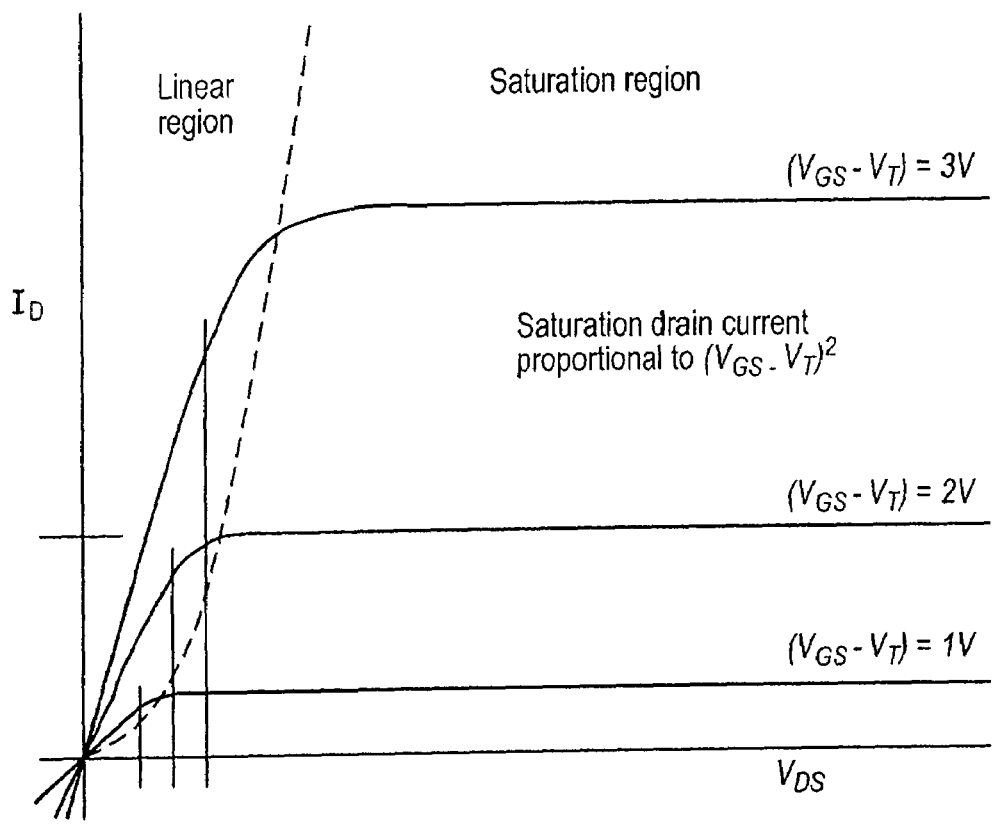
FIG. 5 is a diagram showing an ideal transfer characteristic of a field effect transistor.

In use, transistor $M_1$ functions as the main amplification device and is biased into the saturation region of its transfer characteristic whereas transistor $M_2$ is biased into its linear region. By the term "saturation region" it is meant that for a given gate-source voltage greater than the threshold voltage $V_T$ of the transistor then the drain current $I_D$ is substantially constant with respect to changes in the drain-source voltage. Therefore the current passing through the transistor is responsive to a first order approximation, only to changes in the gate-source voltage. This is the normal regime while operating a FET transistor as an amplifier, and is illustrated in the transfer characteristics shown in FIG. 5.

Figure 6:
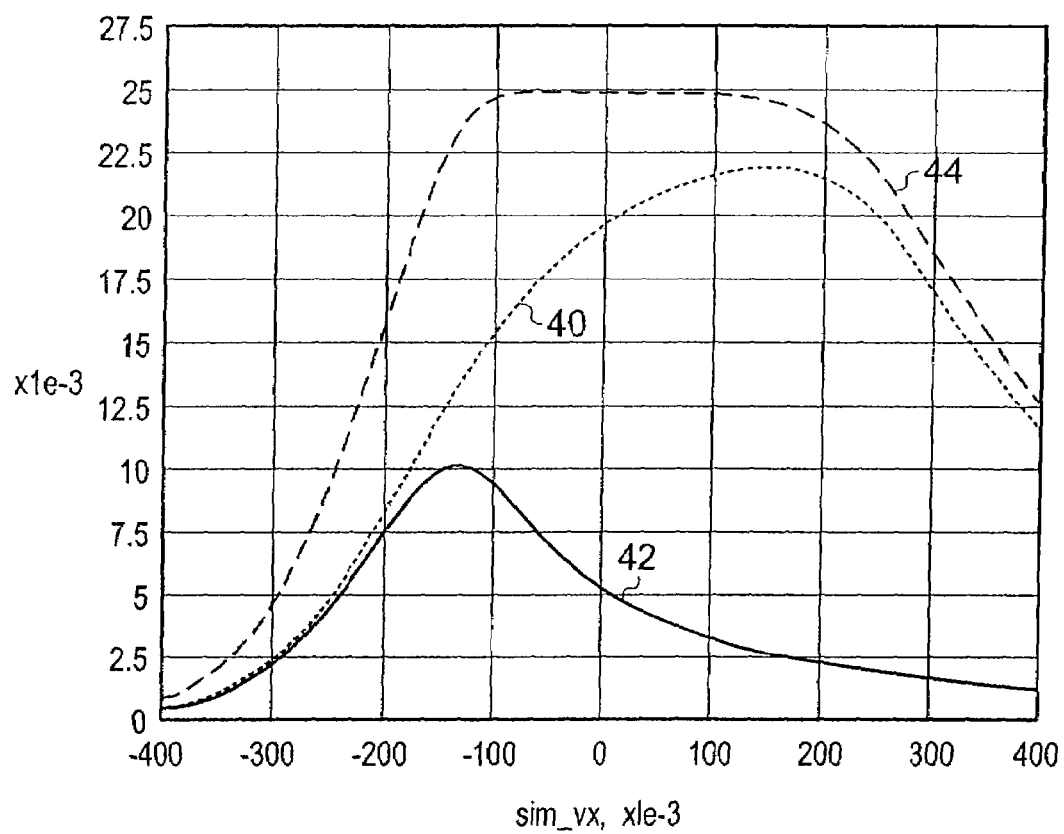
FIG. 6 schematically illustrates how non-linearity compensation can be achieved.

For a given bias voltage $V_{b1}$ changes to the transconductance of the first transistor $M_1$ resulting from an input signal supplied at the gate terminal are shown in FIG. 6 by the chain line 40. It can be seen that the first transistor $M_1$ is biased into a region such that its transconductance increases with increasing gate-source voltage.

By way of contrast, the transistor $M_2$ is biased into its "linear region". This is the region designated in FIG. 5 where for a given gate-source voltage the drain-source current is substantially proportional to the drain-source voltage. In this region the field effect transistor is effectively functioning as a voltage controlled resistor. Therefore the transconductance of transistor can also be represented as being like a voltage controlled current source, so for $M_2$ in its linear region $$g_m^L = K \cdot V_{DS}$$

where

K is a constant

If appropriate circuitry is added, i.e. transistor $M_3$, so as to vary the drain-source voltage of $M_2$ as a function of $V_{gs}$ such that $$V_{DS} = V_0 + \alpha V_{gs}$$

where α is a coefficient then the effective transconductance of $M_2$ is $$= \frac{d}{dV_{gs}} \beta \left[ (V_{gs} - V_{th})(V_0 + \alpha V_{gs}) - \left( \frac{V_0 + \alpha V_{gs}}{2} \right)^2 \right]$$

$$= \beta \left[ V_0(1-\alpha) - V_{th}\alpha + V_{gs} \cdot 2\alpha \left(1 - \frac{\alpha}{2}\right) \right]$$

which is a linear fumction of $V_{gs}$.

It should be noted that the co-efficient α can be selected such that the gradient of this linear function can be made negative. This is not achievable with a transistor in saturation.

The transconductance of the combination of the second and third transistor, $dV_{GS}/dI_{DS}$ is designated by the solid line 42 in FIG. 6.

It can be seen with suitable biasing of the first and second transistors $M_1$ and $M_2$ that the changes in transconductance in response to an AC signal centred, by definition, about zero volts can result in the changes in transconductance effectively cancelling each other out such that a composite transconductance designated by the chain line 44 of FIG. 6 is obtained which is generally independent of the input signal swung over a limited voltage range.

It can be seen that, in this example, improved linearity is obtained for signal amplitudes smaller than 100 mV. Analysis of the curve shows that the second and third order derivatives of $I_D$ as a function of $V_{GS}$ are simultaneously considerably smaller than that which is achievable with a single transistor. Thus, the arrangement shown in FIG. 4 behaves like a single transistor with improved linearity characteristics.

Figure 7:
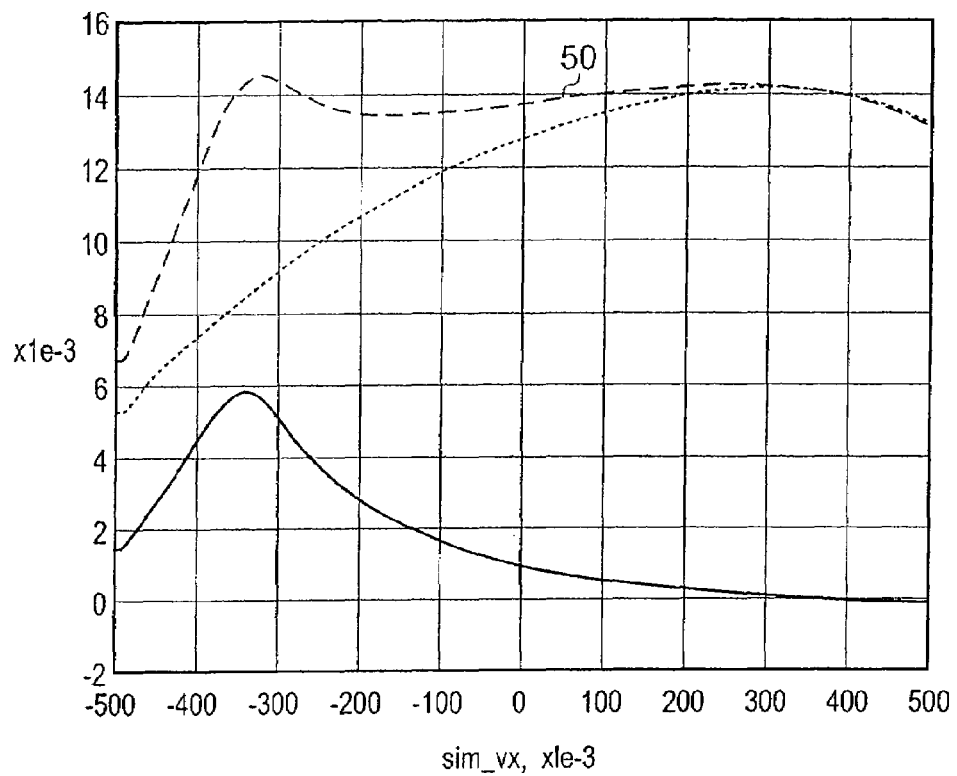
FIG. 7 shows a further bias arrangement adapted to give improved dynamic range.
Figure 8:
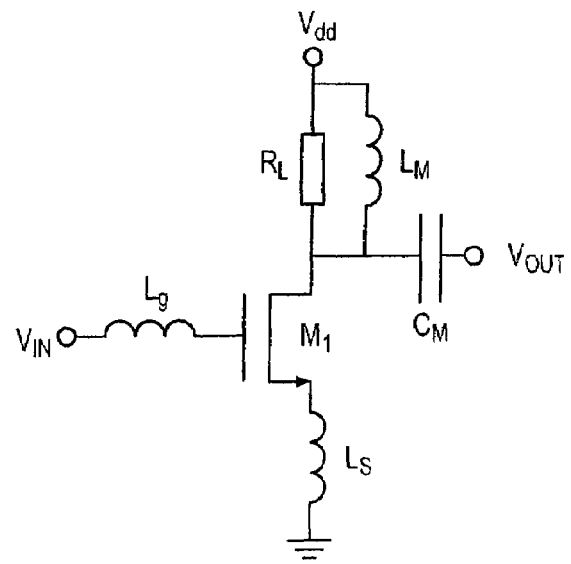
FIG. 8 shows an amplifier circuit into which the arrangement of FIG. 4 was inserted in place of the transistor.

Linearity can be traded for dynamic range, as shown in FIG. 7 where the composite linearity, as indicated by chain line 50 is not as flat as the corresponding curve 44 in FIG. 6, but where the effective signal range for which the transconductance is relatively linear (the relative change in transconductance is less than 10% in this example) now extends to ±350 mV or so. In order to evaluate performance, a simplified well known low noise amplifier circuit, as shown in FIG. 8, was used and its transistor was replaced by the circuit shown in FIG. 4. The arrangement shown in FIG. 4 was biased so as to obtain the response curve shown in FIG. 6. The circuit performance was simulated with transistors $M_2$ and $M_3$ having dimensions of 78 μm by 0.18 μm and transistors $M_1$ and $M_4$ having dimensions of 85.8 μm by 0.18 μm. The gate source bias voltage was 784 mV for $M_1$ and 800 mV for $M_2$. The current used by the circuit was 8.5 mA and the improvement in the $IP_3$ intercept point compared with an equivalent low noise amplifier similar gain, noise and input/output impedance is around 10 dB. Effectively the same amplifier configuration was used to investigate the large signal performance where the transistors were sized and biased so as to obtain the response shown in FIG. 7. In this arrangement transistors $M_2$ and $M_3$ had dimensions of 78 μm by 0.4 μm, whereas transistor $M_1$ was 46.8 μm by 0.36 μm and transistor $M_4$ was 93.6 μm by 0.18 μm. The gate source bias voltage was 978 mV for transistor $M_2$ and 1.127 volts for transistor $M_1$. The amplifier consumed a current of 7.2 mA and exhibited in 1 dB compression point at an input power of 5 dBm.

Considering the small signal amplifier, it can be noted that if $V_{b1}$ is too low, then the curve representing the transconductance of $M_1$ in FIG. 6 shifts along the X axis in the positive direction and the slope of the transconductance at the zero volt signal input value becomes positive. If $V_{b1}$ is too high, then the curve representing the transconductance of the transistor $M_1$ shifts in a negative direction and the slope of the composite transconductance at the zero input value becomes negative. The flatness of the transconductance curve as a function of the input voltage can therefore be changed by appropriately choosing the bias potential $V_{b1}$. The circuit shown in FIG. 9 measures the slope of the transconductance of the transconducting circuit shown in FIG. 4 and finds the bias potential $V_{b1}$ which brings the slope of the transconductance close to zero for zero AC input signal.

Figure 9:
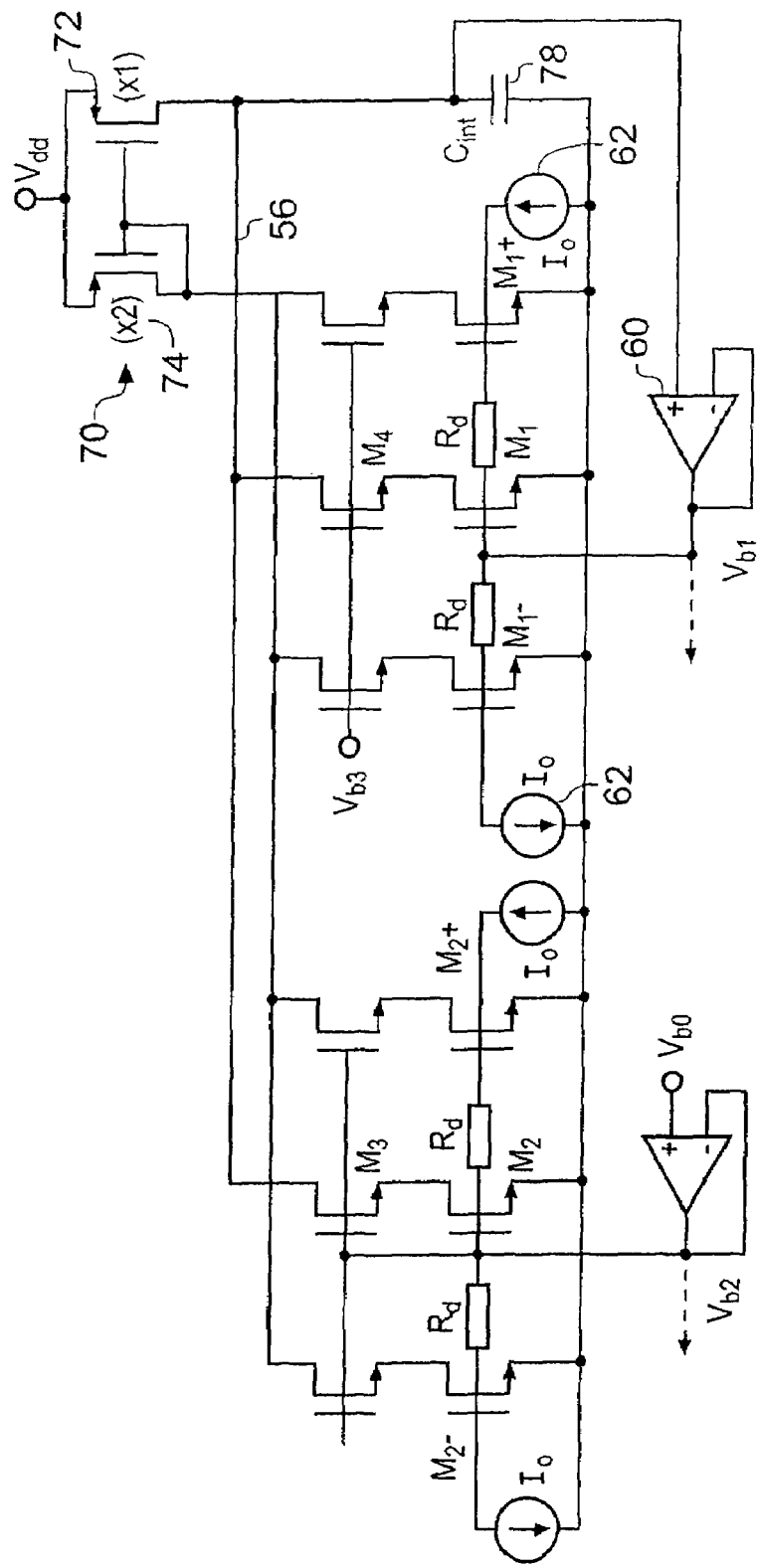
FIG. 9 shows a bias voltage generator including a calculator for assessing an optimum bias point.

In the arrangement shown in FIG. 9 it can be seen that the arrangement shown in FIG. 4 is effectively reproduced three times. Therefore, transistors $M_1$, $M_2$, $M_3$ and $M_4$ are effectively configured in an identical arrangement compared to that shown in FIG. 4. Considering transistor $M_1$ in greater detail, it can be seen that it is provided with a bias voltage $V_{b1}$ derived at the output of the operational amplifier 60. The voltage from the amplifier 60 is also provided to the gate of transistor $M_1$+(situated to the right of transistor $M_1$ in FIG. 9) and to transistor $M_1$ (situated to the left of transistor $M_1$ in FIG. 9). The current source 62 and sink 64 are provided such that the transistor $M_1$+ has a gate voltage slightly in excess of that occurring at transistor $M_1$ whereas transistor $M_1$- has a gate voltage slightly less than that occurring at transistor $M_1$. A similar circuit is associated with transistor $M_2$. The transistors in the circuit shown in FIG. 9 may be scaled replicas of the transistors of the transconductance circuit such that the current drawn by the circuit can be reduced but the current density within the transistors is the same as the transconductance circuit.

It is known that the gradient of the transconductance can be formed, at a given bias voltage, by calculating the current passing through the circuit at the bias voltage, at a first test voltage which is slightly more than the bias voltage, and at a second test voltage which is slightly less than the bias voltage, and then forming the sum $$\frac{Y_+ - 2Y_0 + Y_-}{\Delta X^2}$$

where $Y_+$ represents the current flowing at the bias voltage plus the increment $\Delta X$, $Y_0$ represents the current flowing at the bias voltage X and $Y_-$ represents the current flowing at the bias voltage $-\Delta X$, and $\Delta X$ represents the size of the perturbation used in the test. In fact, the circuit only needs to evaluate the numerator of this expression. The circuit shown in FIG. 9 performs this calculation in the analog domain by comparing the current flowing through the unperturbed circuit with the sum of the current flowing through the "+" and "−" circuits where the "+" and the "−" designates those circuits which have the perturbing voltage added or subtracted from the bias voltage. The individual currents are supplied to an active load 70 which forces current flowing through transistor 72 to match that flowing through transistor 74 subject to a scaling factor of 2. Therefore any current difference which needs to flow along the conductor 76 towards the unperturbed circuit is derived by either charging or discharging the capacitor 78, as appropriate. The voltage occurring across the capacitor is used as the reference voltage in the operational amplifier 60, thereby forming a feedback loop. Thus the circuit shown in FIG. 9 seeks to adjust the bias voltage $V_{b1}$ in order to linearise the transconductance of the circuit shown in FIG. 4, i.e. to set $$\frac{d^2 I_{DS}}{dV_{GS}^2}$$

to zero, or as close to zero as it can manage.

Figure 10A:
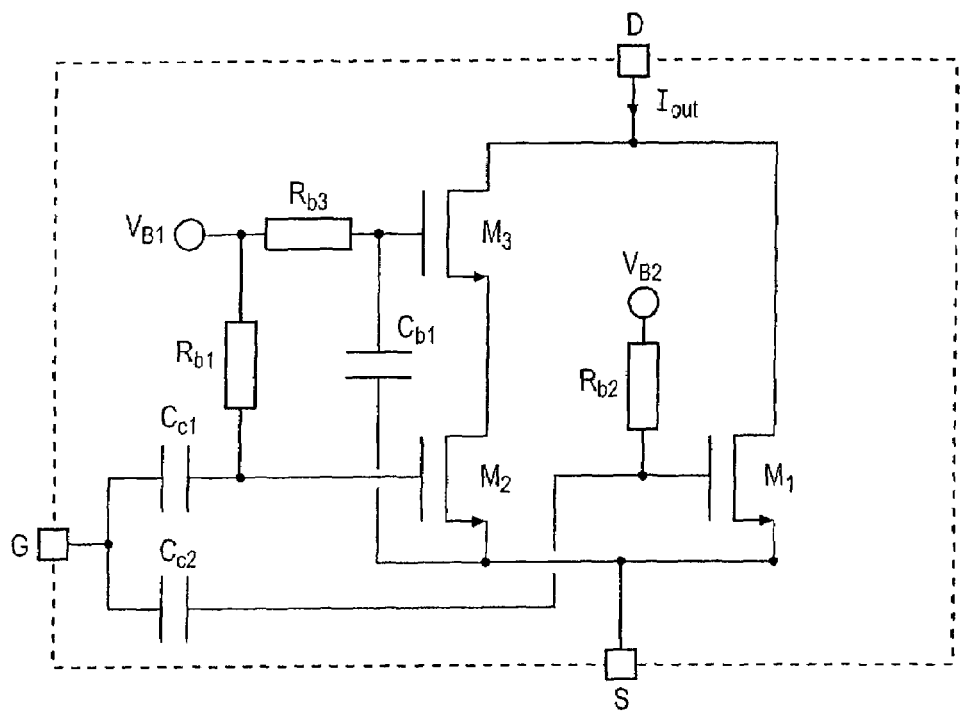
FIGS. 10a and 10b show variations to the circuit of FIG. 4.
Figure 10B:
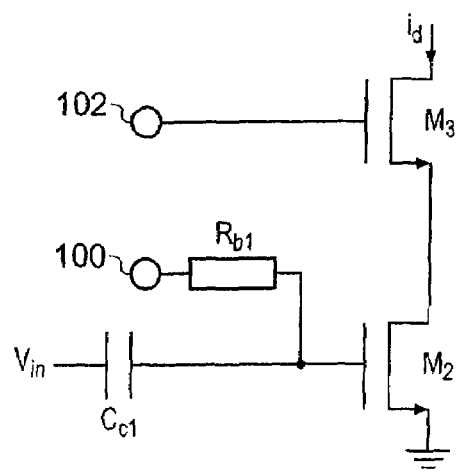

FIG. 10a shows a circuit diagram equivalent to that of FIG. 4, but with transistor M4 omitted. This means that capacitor 34, resistor 30 and bias node $V_{B3}$ can also be omitted.

The bias circuit around transistors $M_2$ and $M_3$ can also be modified such that, $M_2$ can be directly connected to a bias node 100 via resistor $R_{B1}$ such that the signal $V_{in}$ can be superimposed upon the bias voltage whereas transistor $M_3$ can be directly connected to bias node 102. In this way, the transistors can be set to individual bias voltages.

Figure 11A:
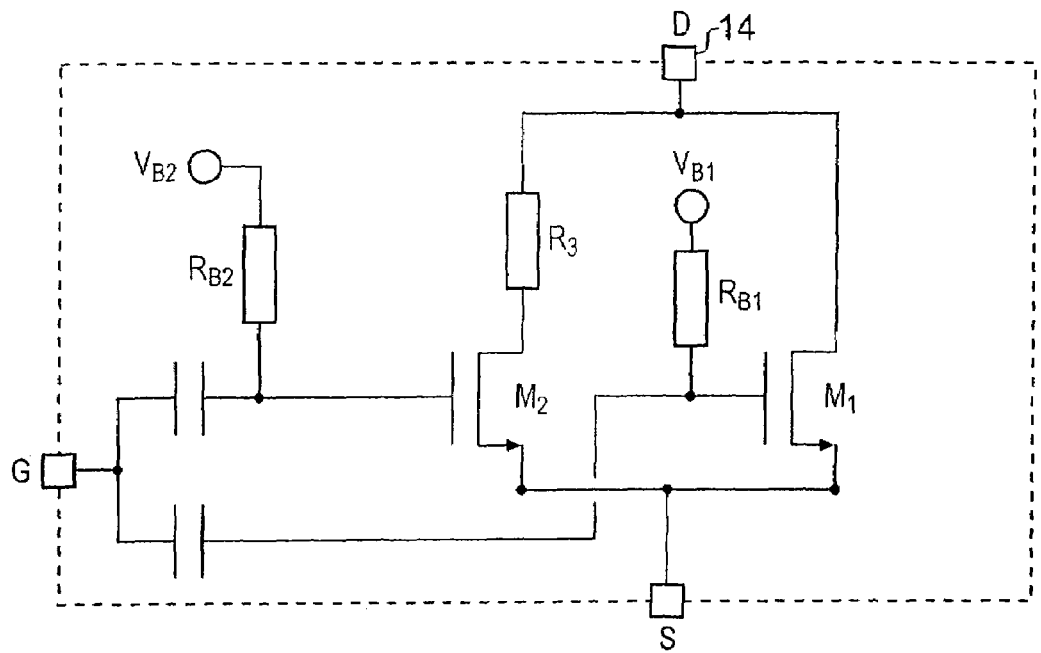
FIGS. 11a and 11b show further variations to the circuit shown in FIG. 4.
Figure 11B:
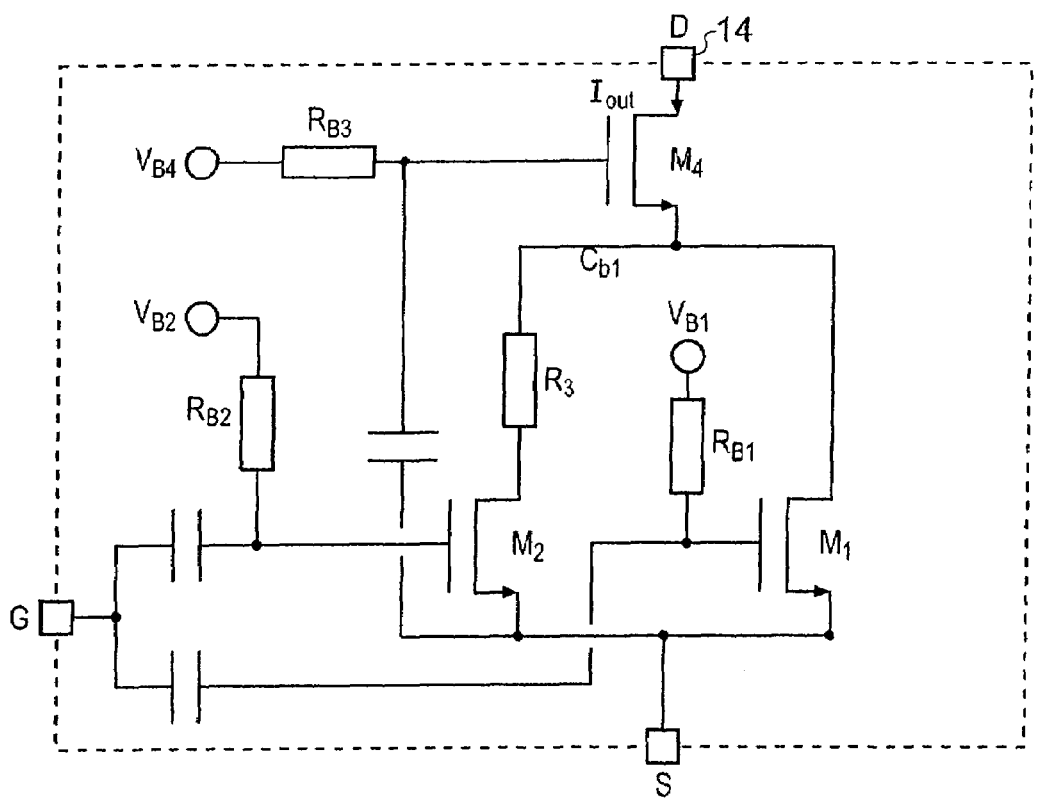

It was noted earlier that the voltage modulator could be formed by a resistor. FIG. 11a shows a further embodiment of the present invention where the cascode transistor $M_4$ has been omitted and the modulating transistor $M_3$ has been replaced by resistor $R_3$. This circuit can work provided that the drain source voltage of transistor $M_2$ is independent of the voltage at the second node, that is the effective drain terminal 14 of the transconductance circuit. This can be achieved where, for example, the transconductance circuit is used to drive a cascode transistor and consequently in the overall amplifier configuration the voltage at node 14 is substantially invariant. However, where this cannot be achieved then the cascode transistor $M_4$ of FIG. 4 can be shared by transistors $M_1$ and $M_2$, as shown in FIG. 11b. In this arrangement the voltage occurring at the source terminal of transistor $M_4$ is substantially invariant of the voltage occurring at the node 14 of the transconductance circuit and therefore resistor $R_3$ can be used to modulate the drain source voltage across transistor $M_2$ so as to reduce the drain source voltage as the current through transistor $M_2$ increases.

It is thus possible to provide a transconductance circuit which functions as a transistor having improved linearity and a circuit for optimally biasing the transconductance circuit.

The invention claimed is:

1. A transconductance circuit, comprising:
   first and second field effect transistors of a same type, each having a drain, a source and a gate;
   wherein the first transistor is in a first current flow path between first and second nodes of the circuit, and is biased so as to operate in a saturation region of its transfer characteristic;
   the second field effect transistor is in a second current flow path between the first and second nodes of the circuit and is biased so as to operate in a linear region of its transfer characteristic;
   the gates of the first and second transistors are connected to receive an input signal; and
   wherein the second transistor is further in series with a voltage modulator adapted to reduce the drain-source voltage occurring across the second transistor in response to increased current flow in the second transistor.

2. A transconductance circuit as claimed in claim 1, in which the voltage modulator comprises a third field effect transistor in series with the second field effect transistors.

3. A transconductance circuit as claimed in claim 1, in which the gate of the first field effect transistor is connected to a first bias node.

4. A transconductance circuit as claimed in claim 1, in which the gate of the second field effect transistor is connected to a second bias node.

5. A transconductance circuit as claimed in claim 2, in which the gate of the third transistor is connected to a third bias node.

6. A transconductance circuit as claimed in claim 1, in which the modulator comprises a third field effect transistor in series with the second field effect transistor and the gate of the third transistor is connected to the second bias node.

7. A transconductance circuit as claimed in claim 1, in which a fourth transistor is interposed between the first transistor and the second node, the drain of the first transistor is connected to the source of the fourth transistor and the drain of the fourth transistor is connected to the second node.

8. A transconductance circuit as claimed in claim 7, in which the gate of the fourth transistor is connected to a fourth bias node.

9. A transconductance circuit as claimed in claim 2, in which the source of the third transistor is connected to the drain of the second transistor and the drain of the third transistor is connected to the second node of the amplifier.

10. A transconductance circuit as claimed in claim 1, in which the first and second transistors are biased such that over an operating range changes in transconductance of the first transistor with respect to changes in gate-source voltage are in opposition to changes in transconductance of the second transistor with respect to changes in gate-source voltage.

11. A transconductance circuit as claimed in claim 1, in which the voltage modulator is a resistor.

12. A transconductance circuit as claimed in claim 11, in which the resistor is in series with a cascode transistor.

13. A transconductance circuit as claimed in claim 10, in which the operating range covers an AC signal input range of substantially ±100 mV.

14. A transconductance circuit as claimed in claim 10, in which the operating signal range is substantially ±330 mV.

15. A transconductance circuit as claimed in claim 1, in combination with a bias circuit, wherein the bias circuit includes a derivative calculator for calculating the derivative of the transconductance and a feedback circuit for adjusting a bias voltage as a function of the calculated derivative of the transconductance.

16. A method of compensating for non-linearities of a first field effect transistor, where the first transistor is operated as a single-ended amplifier and is, in use, biased into its saturation region of its transfer characteristic,
   the method comprising the steps of providing a second field effect transistor in parallel with the first transistor and of a same type as the first field effect transistor, the second transistor being biased into its "linear region" and in series with a modulator for modulating its drain-source voltage as a function of an input signal to the first field effect transistor such that changes in its transconductance with respect to input voltage partially or wholly cancel changes in transconductance of the first transistor.

17. A method as claimed in claim 16, wherein the modulator is a further field effect transistor in series with the second field effect transistor having its gate held at a constant voltage with respect to the source of the first transistor.

18. A single ended transconductance circuit, comprising:
   first and second field effect transistors, each having a drain, a source and a gate;
   wherein the first transistor is in a first current flow path between first and second nodes of the circuit, and is biased so as to operate in a saturation region of its transfer characteristic;
   the second field effect transistor is in a second current flow path between the first and second nodes of the circuit and is biased so as to operate in a linear region of its transfer characteristic;
   the gates of the first and second transistors are connected to receive an input signal; and
   wherein the second transistor is further in series with a voltage modulator adapted to reduce the drain-source voltage occurring across the second transistor in response to increased current flow in the second transistor.

19. A transconductance circuit as claimed in claim 18, in which the first and second field effect transistors are N type devices.

20. A transconductance circuit as claimed in claim 18, in which the first and second current flow paths are in parallel.

21. A transconductance circuit as claimed in claim 18, in which the voltage modulator comprises a third field effect transistor in series with the second field effect transistors.

22. A transconductance circuit as claimed in claim 21, in which a fourth transistor is interposed between the first transistor and the second node, the drain of the first transistor is connected to the source of the fourth transistor and the drain of the fourth transistor is connected to the second node.

23. A transconductance circuit as claimed in claim 18, in which the first and second transistors are biased such that over an operating range changes in transconductance of the first transistor with respect to changes in gate-source voltage are in opposition to changes in transconductance of the second transistor with respect to changes in gate-source voltage.

24. A transconductance circuit, comprising:
first and second field effect transistors, each having a drain, a source and a gate;
wherein the first transistor is in a first current flow path between first and second nodes of the circuit, and is biased so as to operate in a saturation region of its transfer characteristic;
the second field effect transistor is in a second current flow path between the first and second nodes of the circuit and is biased so as to operate in a linear region of its transfer characteristic;
the gates of the first and second transistors are connected to receive an input signal; and
wherein the second transistor is further in series with a voltage modulator adapted to reduce the drain-source voltage occurring across the second transistor in response to increased current flow in the second transistor, and
in which a further transistor is interposed between the first transistor and the second node, the drain of the first transistor is connected to the source of the further transistor and the drain of the further transistor is connected to the second node.

25. A transconductance circuit as claimed in claim 24, in which the gate of the further transistor is connected to a fourth bias node.

26. A transconductance circuit, comprising:
first and second field effect transistors, each having a drain, a source and a gate;
wherein the first transistor is in a first current flow path between first and second nodes of the circuit, and is biased so as to operate in a saturation region of its transfer characteristic;
the second field effect transistor is in a second current flow path between the first and second nodes of the circuit and is biased so as to operate in a linear region of its transfer characteristic;
the gates of the first and second transistors are connected to receive an input signal; and
wherein the second transistor is further in series with a voltage modulator adapted to reduce the drain-source voltage occurring across the second transistor in response to increased current flow in the second transistor, and
in which the first and second transistors are biased such that over an operating range changes in transconductance of the first transistor with respect to changes in gate-source voltage are in opposition to changes in transconductance of the second transistor with respect to changes in gate-source voltage.

27. A transconductance circuit, comprising:
first and second field effect transistors, each having a drain, a source and a gate;
wherein the first transistor is in a first current flow path between first and second nodes of the circuit, and is biased so as to operate in a saturation region of its transfer characteristic;
the second field effect transistor is in a second current flow path between the first and second nodes of the circuit and is biased so as to operate in a linear region of its transfer characteristic;
the gates of the first and second transistors are connected to receive an input signal; and
wherein the second transistor is further in series with a voltage modulator adapted to reduce the drain-source voltage occurring across the second transistor in response to increased current flow in the second transistor, and
in which the voltage modulator is a resistor in series with a cascode transistor.

28. A transconductance circuit, comprising:
first and second field effect transistors, each having a drain, a source and a gate;
wherein the first transistor is in a first current flow path between first and second nodes of the circuit, and is biased so as to operate in a saturation region of its transfer characteristic;
the second field effect transistor is in a second current flow path between the first and second nodes of the circuit and is biased so as to operate in a linear region of its transfer characteristic;
the gates of the first and second transistors are connected to receive an input signal;
wherein the second transistor is further in series with a voltage modulator adapted to reduce the drain-source voltage occurring across the second transistor in response to increased current flow in the second transistor; and
in combination with a bias circuit, wherein the bias circuit includes a derivative calculator for calculating the derivative of the transconductance and a feedback circuit for adjusting a bias voltage as a function of the calculated derivative of the transconductance.

* * * * *